(12) United States Patent
Liu et al.

(10) Patent No.: US 11,356,067 B2
(45) Date of Patent: Jun. 7, 2022

(54) ACTIVE DIGITAL TELEVISION (DTV) AMPLIFIER WITH SIGNAL DETECTION AND DISPLAY FUNCTIONS

(71) Applicant: Jiangxi Innovation Technology Co., Ltd., Ji'an (CN)

(72) Inventors: Xiaobing Liu, Ji'An (CN); Qin Li, Ganzhou (CN)

(73) Assignee: Jiangxi Innovation Technology Co., Ltd., Ji'an (CN)

( * ) Notice: Subject to any disclaimer, the term of this patent is extended or adjusted under 35 U.S.C. 154(b) by 175 days.

(21) Appl. No.: 16/970,299

(22) PCT Filed: Nov. 22, 2019

(86) PCT No.: PCT/CN2019/120239
§ 371 (c)(1),
(2) Date: Aug. 14, 2020

(87) PCT Pub. No.: WO2021/082121
PCT Pub. Date: May 6, 2021

(65) Prior Publication Data
US 2021/0367565 A1 Nov. 25, 2021

(30) Foreign Application Priority Data
Oct. 28, 2019 (CN) .......................... 201911030344.6

(51) Int. Cl.
*H04N 5/44* (2011.01)
*H03F 3/19* (2006.01)

(52) U.S. Cl.
CPC ................. *H03F 3/19* (2013.01); *H04N 5/44* (2013.01); *H03F 2200/294* (2013.01)

(58) Field of Classification Search
None
See application file for complete search history.

(56) References Cited

U.S. PATENT DOCUMENTS

| | | | |
|---|---|---|---|
| 7,133,082 B2* | 11/2006 | Limberg | H04N 21/426 348/E5.002 |
| 2018/0364332 A1* | 12/2018 | Stann | G01S 17/42 |
| 2020/0025883 A1* | 1/2020 | Stann | G01S 7/4817 |

* cited by examiner

*Primary Examiner* — Samira Monshi

(57) ABSTRACT

Disclosed is an active DTV amplifier for amplifying signals and detecting and displaying the intensity of signals of an antenna. The amplifier is connected between the antenna and a coaxial cable and includes a primary signal amplification circuit connected to the antenna for performing a primary amplification of a captured antenna signal, a secondary signal amplification circuit connected to the coaxial cable for performing a secondary amplification of the antenna signal and outputting the amplified signal to a feeder coaxial cable, a signal shunt circuit for splitting and the antenna signal processed by the primary amplification into two and assigning the split signals to the single detection circuit and the secondary signal amplification circuit, and a single detection circuit connected to a microcontroller for feeding the collected antenna signal back to the microcontroller which is connected to a display screen to instantly display the intensity of the signal.

5 Claims, 6 Drawing Sheets

ACTIVE DIGITAL TELEVISION (DTV) AMPLIFIER WITH SIGNAL DETECTION AND DISPLAY FUNCTIONS

FIELD OF THE INVENTION

The present invention relates to the technical field of communications, and more particularly to an active DTV amplifier with signal detection and display functions.

BACKGROUND OF THE INVENTION

In the operating principle of a conventional active DTV antenna, an antenna vibrator is provided for receiving weak electromagnetic waves (including useful signals and interference signals) in the air, and sending the electromagnetic waves to a low noise amplifier (LNA) through a coaxial cable to perform a basic signal amplification. In this process, the present existing design is unable to detect the intensity of a signal or visually observe the signal.

SUMMARY OF THE INVENTION

In view of the aforementioned drawbacks of the conventional signal amplifier, the present invention provides an active DTV amplifier with signal detection and display functions, and the active DTV amplifier is provided for amplifying a signal and detecting the intensity of the signal of an antenna disposed at a current position, while displaying the intensity of the signal.

Therefore, it is a primary objective of the present invention to disclose an active DTV amplifier with signal detection and display functions coupled between an antenna and a coaxial cable terminal and comprising: a primary signal amplification circuit, a secondary signal amplification circuit, a signal shunt circuit, and a single detection circuit, wherein the primary signal amplification circuit is coupled to the antenna and provided for performing a primary amplification of a captured antenna signal; the signal shunt circuit is provided for splitting the antenna signal processed by the primary amplification into two and assigning the two split signals to a single detection circuit and a secondary signal amplification circuit respectively; the secondary signal amplification circuit is coupled to the coaxial cable and provided for performing a secondary amplification of the antenna signal and outputting the amplified antenna signal to a feeder coaxial cable; and the single detection circuit is coupled to a microcontroller and provided for feeding back the collected antenna signal to the microcontroller, and the microcontroller is coupled to a display screen to instantly display the intensity of the signal.

In one or more embodiments of the present invention, the signal shunt circuit comprises two Balun transformers, and the two Balun transformers have a primary side coupled to the primary signal amplification circuit and a secondary side coupled to the secondary signal amplification circuit and the single detection circuit.

In one or more embodiments of the present invention, the single detection circuit comprises a first amplification unit, a second amplification unit and an output unit sequentially coupled to one another; the first amplification unit comprises a plurality of resistors R4, R6, R10, a plurality of capacitor C10, C11, and a triode U3; the resistors R10, R6 are serially coupled between a DC source and a base of the triode U3, and a junction of the resistors R10, R6 is coupled to a collector of the triode U3, and the resistor R4 and the capacitor C10 are serially coupled to each other and then parallelly coupled to both terminals of the resistor R6, and the base of the triode U3 is coupled to the capacitor C11 to serve as an output terminal of the first amplification unit, and the collector of the triode serves as an input terminal of the first amplification unit; the second amplification unit comprises a plurality of resistors R11, R12, R13, a plurality of capacitors C13, C16, and a triode U4; the resistors R11, R12 are serially coupled between a DC source and a base of the triode U4, and a junction of the resistors R11, R12 is coupled to a collector of the triode U4, and the resistor R13 and the capacitor C116 are serially coupled to each other and then parallelly coupled to both terminals of the resistor R12, and a base of the triode U4 is coupled to a capacitor C113 to serve as an output terminal of the second amplification unit, and a collector of the triode U4 serves as an input terminal of the second amplification unit; the output unit comprises a triode Q2, a diode D2, an inductor L6, and a plurality of capacitors C14, C15, and the triode Q2 has a collector coupled to a DC source and is coupled to an input terminal of a single detection circuit by the collector, and a base of the triode Q2 is coupled to the inductor L6 and the capacitor C14, and a transmitter of the triode Q2 is grounded; and the diode D2 has an anode coupled to a DC source and a cathode coupled to a terminal of an input side of the inductor L6, and a terminal of an output side of the inductor L6 is grounded by the capacitor C15.

In one or more embodiments of the present invention, the primary signal amplification circuit comprises a triode U1, an inductor L1, a plurality of capacitors C7, C8, C9, C12, a plurality of resistors R5, R8, R9, and a plurality of discharge tubes ESD1, ESD2; the triode U1 has a base coupled to the capacitor C9 to serve as an output terminal and a collector coupled to the capacitor C7 to serve as an input terminal, and the inductor L1 and the resistors R9, R8 are sequentially and serially coupled between a DC source and a base of the triode U1, and a junction of the resistors R9, R8 is coupled to a collector of the triode U1, and the resistor R5 and the capacitor C8 are serially coupled to each other and parallelly coupled to both terminals of the resistor R8, and the inductor L1 is grounded by the capacitor C12 and the discharge tube ESD1, and a base of the triode U1 is grounded by the discharge tube ESD2.

In one or more embodiments of the present invention, the secondary signal amplification circuit comprises a triode U2, an inductor L4, a plurality of capacitors C1, C2, C3, C5, a plurality of resistors R1, R2, R3, and a plurality of discharge tubes ESD3, ESD4; the triode U2 has a base coupled to the capacitor C2 to serve as an output terminal and a collector coupled to the capacitor C1 to serve as an input terminal, and the inductor L1 and the resistors R1, R2 are sequentially and serially coupled between a DC source and the base of the triode U2, and a junction of the resistors R1, R2 is coupled to a collector of the triode U2, and the resistor R3 and the capacitor C3 are serially coupled to each other and then parallelly coupled to both terminals of the resistor R2, and the inductor L4 is grounded by the capacitor C5 and the discharge tube ESD4, and a base of the triode U2 is grounded by the discharge tube ESD3.

The present invention has the following advantageous effects: The single detection circuit and display circuit are added into an existing LNA amplifier, so that the position of the maximum amplified signal of the antenna can be detected, and the display technology allow users to view the amplified signal directly, so as to improve the practical use of the amplifier for various different antennas, provide better convenience, and facilitate technicians to observe and adjust the antenna signal instantly.

DESCRIPTION OF THE PREFERRED EMBODIMENTS

The objectives, technical characteristics and effects of the present invention will become apparent with the detailed description of preferred embodiments accompanied with the illustration of related drawings. It is intended that the embodiments and drawings disclosed herein are to be considered illustrative rather than restrictive.

Figure 1:
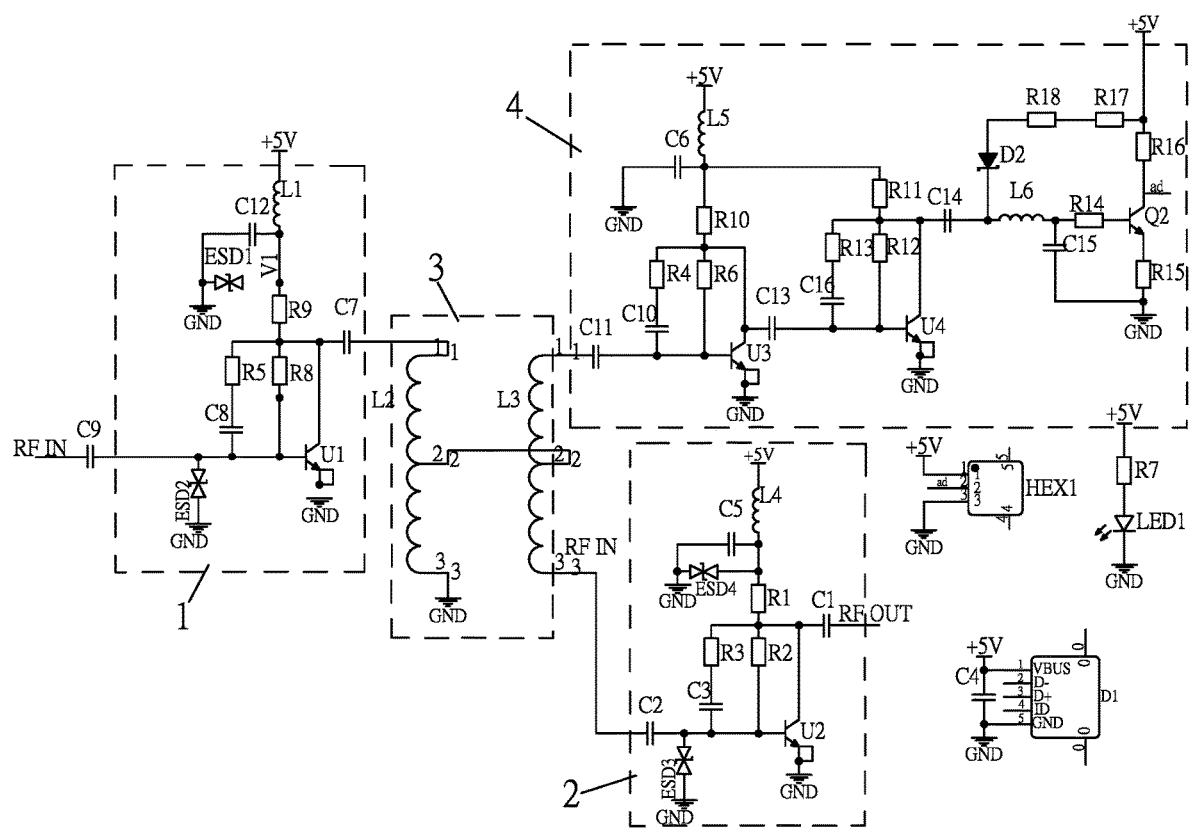
FIG. 1 is a schematic circuit diagram of the present invention.
Figure 2:
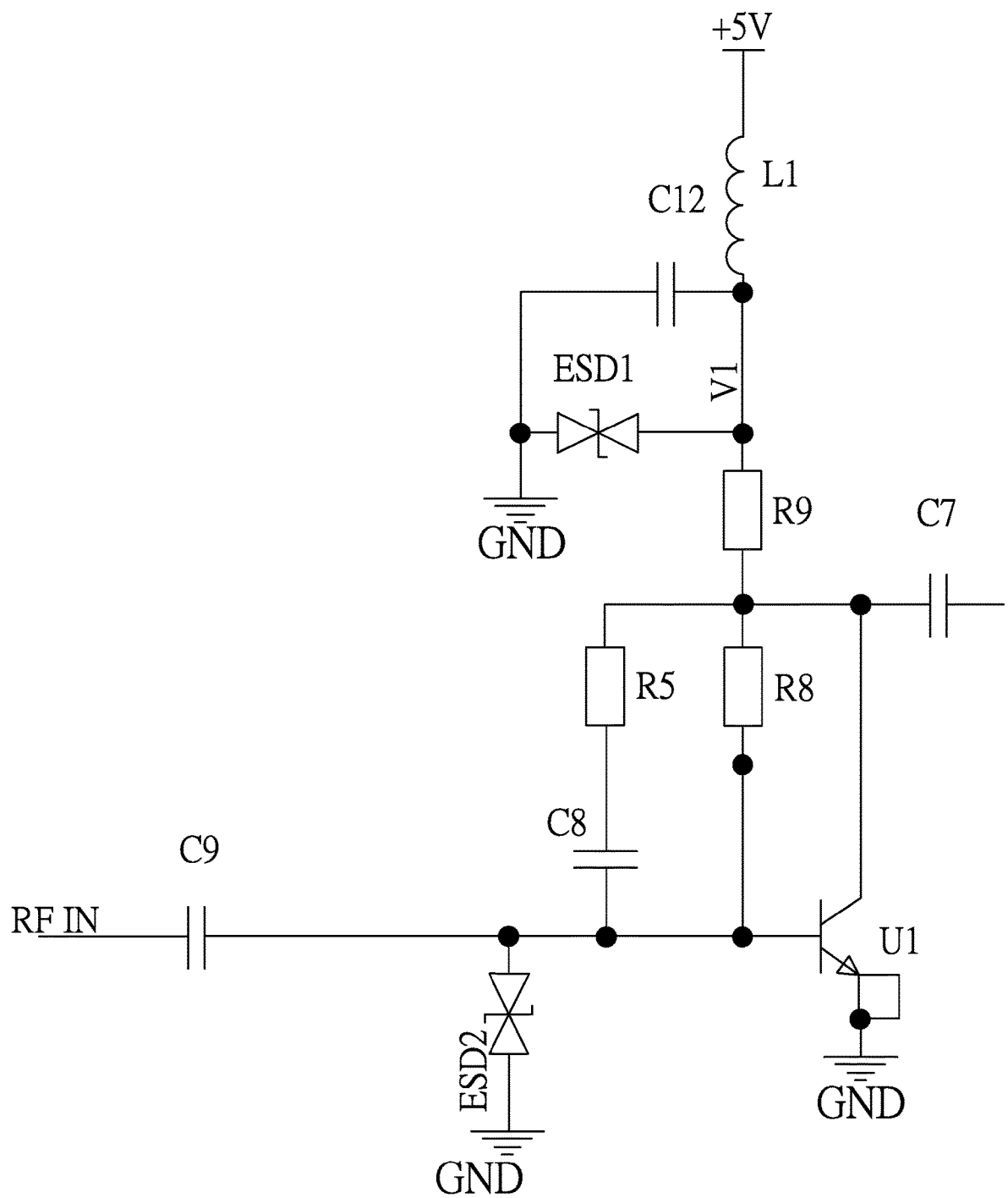
FIG. 2 is a schematic circuit diagram showing the operating principle of a primary signal amplification circuit of the present invention.
Figure 3:
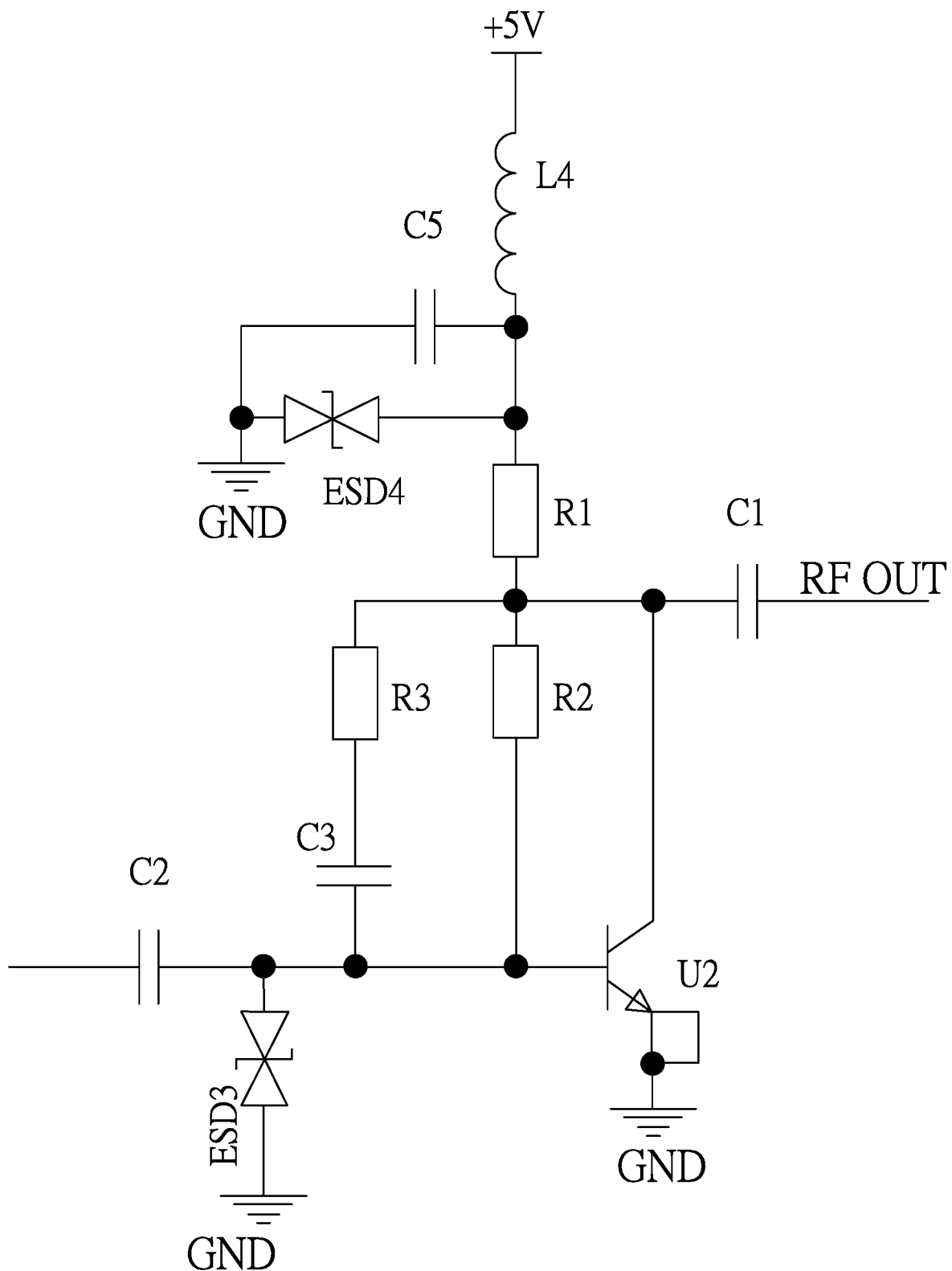
FIG. 3 is a schematic circuit diagram showing the operating principle of a secondary signal amplification circuit of the present invention.
Figure 4:
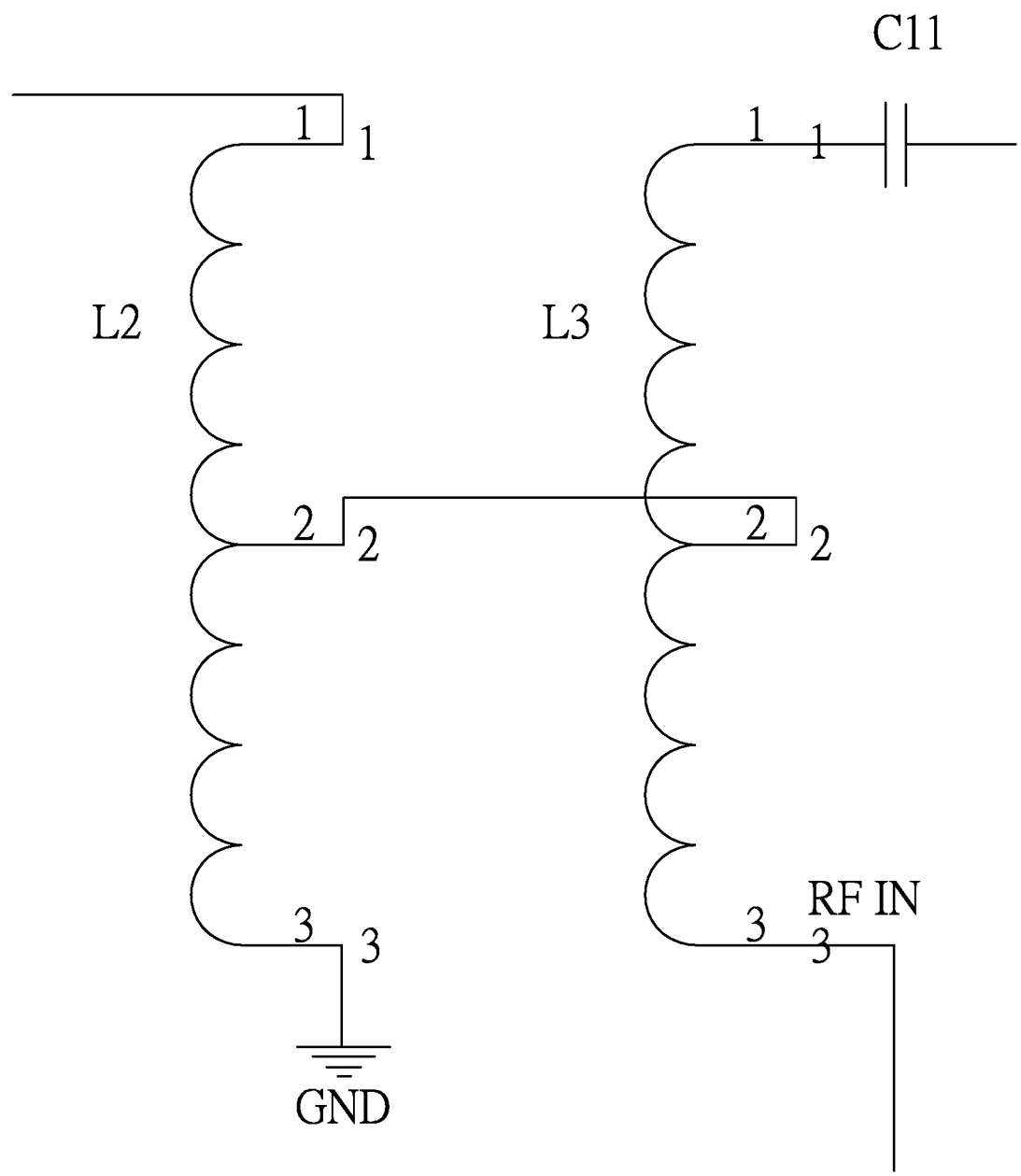
FIG. 4 is a schematic circuit diagram showing the operating principle of a signal shunt circuit of the present invention.
Figure 5:
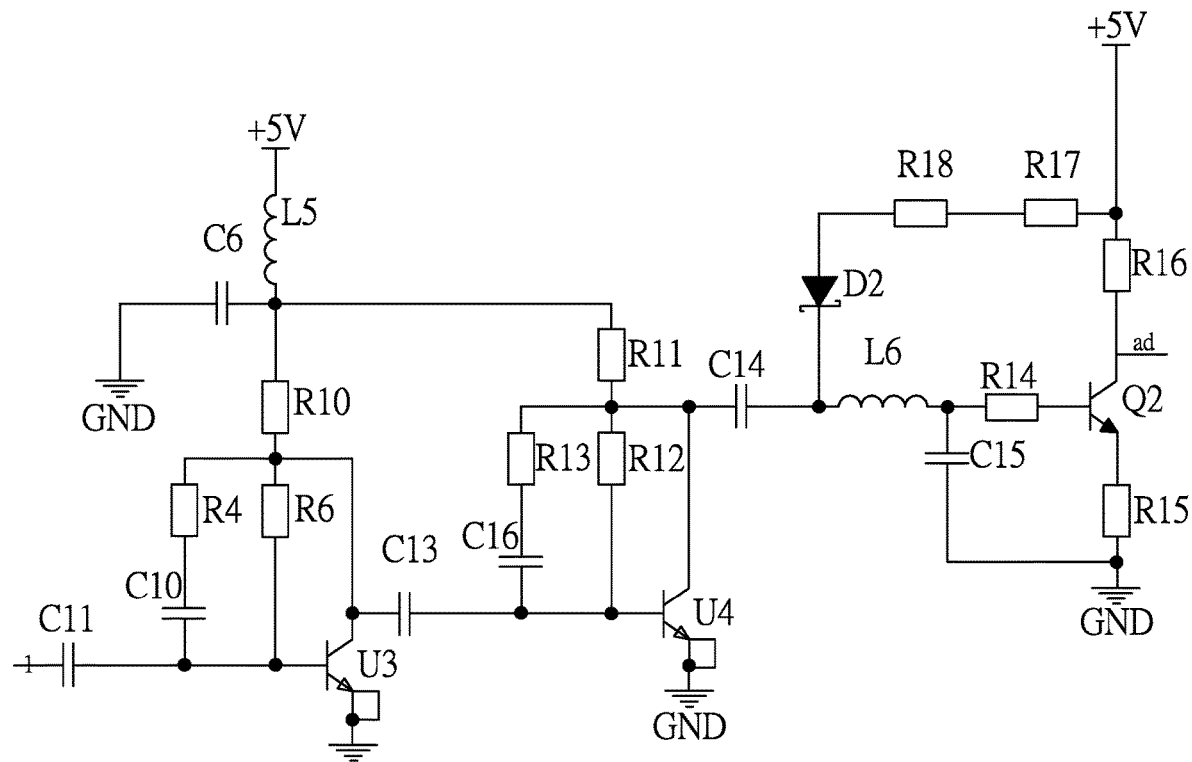
FIG. 5 is a schematic circuit diagram showing the operating principle of a single detection circuit of the present invention.
Figure 6:
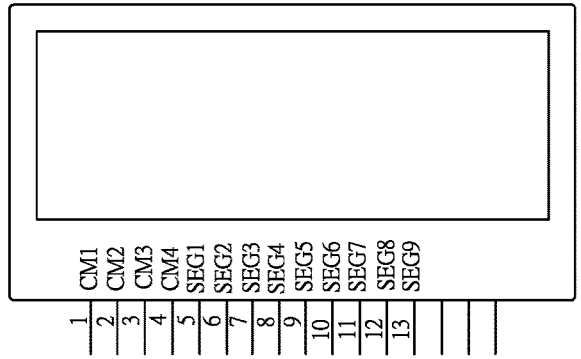
FIG. 6 is a schematic circuit diagram showing the operating principle of a microcontroller and a display circuit of the present invention.
Figure 6:
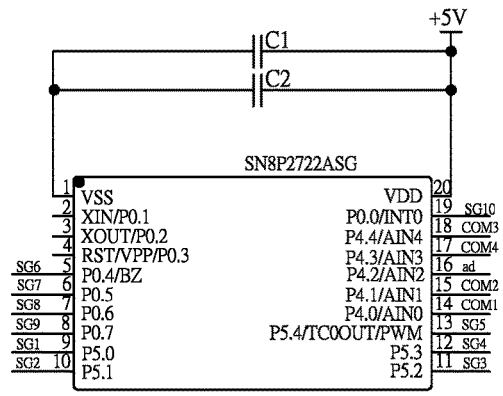
Figure 6:
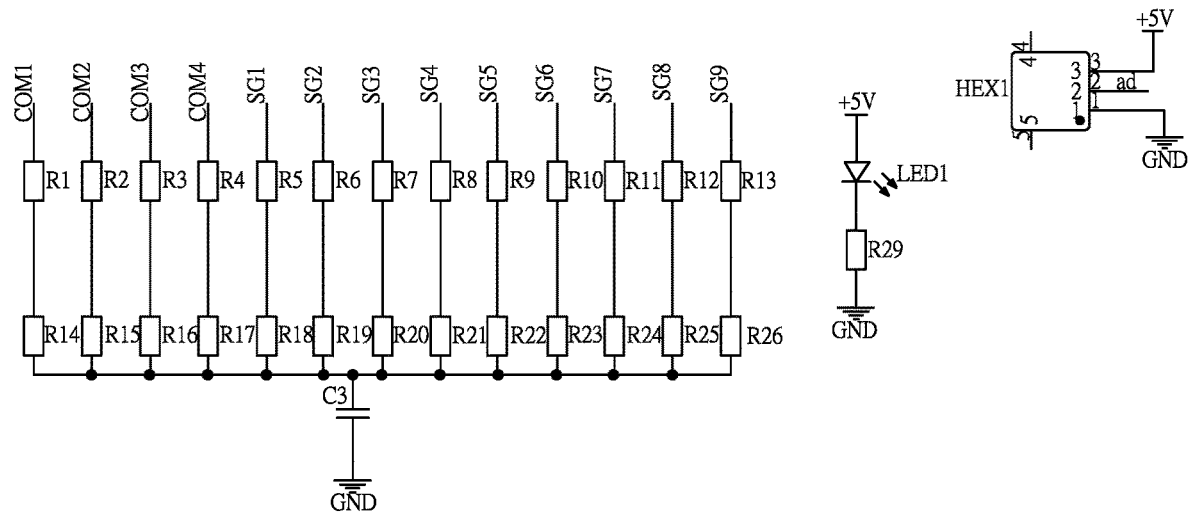

With reference to FIGS. 1 to 6 for an active DTV amplifier with signal detection and display functions of the present invention, the active DTV amplifier with signal detection and display functions is coupled between an antenna and a terminal of a coaxial cable, and the active DTV amplifier comprises: a primary signal amplification circuit 1, a secondary signal amplification circuit 2, a signal shunt circuit 3, and a single detection circuit 4; the primary signal amplification circuit 1 is coupled to the antenna and provided for performing a primary amplification of a captured antenna signal; the signal shunt circuit 3 is provided for splitting the antenna signal processed by the primary amplification into two, and the split signals are assigned to the single detection circuit 4 and the secondary signal amplification circuit 2 respectively; the secondary signal amplification circuit 2 is coupled to the coaxial cable and provided for performing a secondary amplification of the antenna signal and outputting the amplified antenna signal to a feeder coaxial cable; the single detection circuit 4 is coupled to a microcontroller and provided for feeding back the collected antenna signal to the microcontroller, and the microcontroller is coupled to a display screen to instantly display the intensity of the signal.

The signal shunt circuit 3 comprises two Balun transformers, and the two Balun transformers have a primary side coupled to the primary signal amplification circuit and a secondary side coupled to the secondary signal amplification circuit and the single detection circuit.

The single detection circuit 4 comprises a first amplification unit, a second amplification unit and an output unit sequentially coupled to one another; the first amplification unit comprises a plurality of resistors R4, R6, R10, a plurality of capacitors C10, C11, and a triode U3; the resistors R10, R6 are serially coupled between a DC source and a base of the triode U3, and a junction of the resistors R10, R6 is coupled to a collector of the triode U3, and the resistor R4 and the capacitor C10 are serially coupled to each other and then parallelly coupled to both terminals of the resistor R6, and the base of the triode U3 is coupled to the capacitor C11 to serve as an output terminal of the first amplification unit, and the collector of the triode U3 serves as an input terminal of the first amplification unit; the second amplification unit comprises a plurality of resistors R11, R12, R13, a plurality of capacitors C13, C16, and a triode U4; the resistors R11 and R12 are serially coupled between a DC source and a base of the triode U4, and a junction of the resistors R11 and R12 is coupled to a collector of the triode U4, and the resistor R13 and the capacitor C116 are serially coupled to each other and then parallelly coupled to both terminals of the resistor R12, and the base of the triode U4 is coupled to the capacitor C113 to serve as an output terminal of the second amplification unit, and the collector of the second amplification unit serves as an input terminal of the second amplification unit; the output unit comprises a triode Q2, a diode D2, an inductor L6, and a plurality of capacitors C14, C15, and the collector of the triode Q2 is coupled to a DC source, and the triode Q2 is coupled to an input terminal of a single detection circuit by its collector, and the base of the triode Q2 is coupled to the inductor L6 and the capacitor C14, and a transmitter of the triode Q2 is grounded; and the diode D2 has an anode coupled to a DC source and a cathode coupled to a terminal of the input side of the inductor L6, and a terminal of the output side of the inductor L6 is grounded by the capacitor C15.

The primary signal amplification circuit 1 comprises a triode U1, an inductor L1, a plurality of capacitors C7, C8, C9, C12, a plurality of resistors R5, R8, R9, and a plurality of discharge tubes ESD1, ESD2; the triode U1 has a base coupled to the capacitor C9 to serve as an output terminal and a collector coupled to the capacitor C7 to serve as an input terminal, and the inductor L1 and the resistors R9, R8 are sequentially and serially coupled between a DC source and the base of the triode U1, and a junction of the resistors R9, R8 is coupled to the collector of the triode U1, and the resistor R5 and the capacitor C8 are serially coupled to each other and then parallelly coupled to both terminals of the resistor R8, and the inductor L1 is grounded by the capacitor C12 and the discharge tube ESD1, and the base of the triode U1 is grounded by the discharge tube ESD2.

The secondary signal amplification circuit 2 comprises a triode U2, an inductor L4, a plurality of capacitors C1, C2, C3, C5, a plurality of resistors R1, R2, R3, and a plurality of discharge tubes ESD3, ESD4; the triode U2 has a base coupled to the capacitor C2 to serve as an output terminal and a collector coupled to the capacitor C1 to serve as an input terminal, and the inductor L1 and the resistors R1, R2 are sequentially and serially coupled between a DC source and the base of the triode U2, and a junction of the resistors R1, R2 is coupled to the collector of the triode U2, and the resistor R3 and the capacitor C3 are serially coupled to each other and then parallelly coupled to both terminals of the resistor R2, and the inductor L4 is grounded by the capacitor C5 and the discharge tube ESD4, and the base of the triode U2 is grounded by the discharge tube ESD3.

In this embodiment, the primary signal amplification circuit 1 and the secondary signal amplification circuit 2 are microwave bandpass amplifier chips with the model number of a BPF420 series, and the microcontroller is a controller chip with the model number of a SN8P2722 series, and the microcontroller has a timing function to record the operating time of the digital television (DTV). The microcontroller collects the sample of the amplified signal and detects the voltage, and then converts the sampled voltage into a corresponding amplification factor, and finally displays the amplified signal on a display screen, wherein the display device adopts an LCD segmented liquid crystal display and uses the microcontroller to drive the display directly, and the driving mode is ¼ Duty ⅓Bias.

While the invention has been described by means of specific embodiments, numerous modifications and variations could be made thereto by those skilled in the art without departing from the scope and spirit of the invention as set forth in the claims.

What is claimed is:

1. An active DTV amplifier with signal detection and display functions, coupled between an antenna and a terminal of a coaxial cable, comprising: a primary signal amplification circuit, a secondary signal amplification circuit, a signal shunt circuit, and a single detection circuit; the primary signal amplification circuit being coupled to the antenna and provided for performing a primary amplification of a captured antenna signal; the signal shunt circuit being provided for splitting the antenna signal processed by the primary amplification into two and assigning the two split signals to a single detection circuit and a secondary signal amplification circuit respectively; the secondary signal amplification circuit being coupled to the coaxial cable and provided for performing a secondary amplification of the antenna signal and outputting the amplified antenna signal to a feeder coaxial cable; and the single detection circuit being coupled to a microcontroller and provided for feeding back the collected antenna signal to the microcontroller, and the microcontroller being coupled to a display screen to instantly display the intensity of the signal.

2. The active DTV amplifier with signal detection and display functions as claimed in claim 1, wherein the signal shunt circuit comprises two Balun transformers, and the two Balun transformers have a primary side coupled to the primary signal amplification circuit and a secondary side coupled to the secondary signal amplification circuit and the single detection circuit.

3. The active DTV amplifier with signal detection and display functions as claimed in claim 1, wherein the single detection circuit comprises a first amplification unit, a second amplification unit and an output unit sequentially coupled to one another; the first amplification unit comprises a plurality of resistors R4, R6, R10, a plurality of capacitor C10, C11, and a triode U3; the resistors R10, R6 are serially coupled between a DC source and a base of the triode U3, and a junction of the resistors R10, R6 is coupled to a collector of the triode U3, and the resistor R4 and the capacitor C10 are serially coupled to each other and then parallelly coupled to both terminals of the resistor R6, and the base of the triode U3 is coupled to the capacitor C11 to serve as an output terminal of the first amplification unit, and the collector of the triode serves as an input terminal of the first amplification unit; the second amplification unit comprises a plurality of resistors R11, R12, R13, a plurality of capacitors C13, C16, and a triode U4; the resistors R11, R12 are serially coupled between a DC source and a base of the triode U4, and a junction of the resistors R11, R12 is coupled to a collector of the triode U4, and the resistor R13 and the capacitor C116 are serially coupled to each other and then parallelly coupled to both terminals of the resistor R12, and a base of the triode U4 is coupled to a capacitor C113 to serve as an output terminal of the second amplification unit, and a collector of the triode U4 serves as an input terminal of the second amplification unit; the output unit comprises a triode Q2, a diode D2, an inductor L6, and a plurality of capacitors C14, C15, and the triode Q2 has a collector coupled to a DC source and is coupled to an input terminal of a single detection circuit by the collector, and a base of the triode Q2 is coupled to the inductor L6 and the capacitor C14, and a transmitter of the triode Q2 is grounded; and the diode D2 has an anode coupled to a DC source and a cathode coupled to a terminal of an input side of the inductor L6, and a terminal of an output side of the inductor L6 is grounded by the capacitor C15.

4. The active DTV amplifier with signal detection and display functions as claimed in claim 1, wherein the primary signal amplification circuit comprises a triode U1, an inductor L1, a plurality of capacitors C7, C8, C9, C12, a plurality of resistors R5, R8, R9, and a plurality of discharge tubes ESD1, ESD2; the triode U1 has a base coupled to the capacitor C9 to serve as an output terminal and a collector coupled to the capacitor C7 to serve as an input terminal, and the inductor L1 and the resistors R9, R8 are sequentially and serially coupled between a DC source and a base of the triode U1, and a junction of the resistors R9, R8 is coupled to a collector of the triode U1, and the resistor R5 and the capacitor C8 are serially coupled to each other and parallelly coupled to both terminals of the resistor R8, and the inductor L1 is grounded by the capacitor C12 and the discharge tube ESD1, and a base of the triode U1 is grounded by the discharge tube ESD2.

5. The active DTV amplifier with signal detection and display functions as claimed in claim 1, wherein the secondary signal amplification circuit comprises a triode U2, an inductor L4, a plurality of capacitors C1, C2, C3, C5, a plurality of resistors R1, R2, R3, and a plurality of discharge tubes ESD3, ESD4; the triode U2 has a base coupled to the capacitor C2 to serve as an output terminal and a collector coupled to the capacitor C1 to serve as an input terminal, and the inductor L1 and the resistors R1, R2 are sequentially and serially coupled between a DC source and the base of the triode U2, and a junction of the resistors R1, R2 is coupled to a collector of the triode U2, and the resistor R3 and the capacitor C3 are serially coupled to each other and then parallelly coupled to both terminals of the resistor R2, and the inductor L4 is grounded by the capacitor C5 and the discharge tube ESD4, and a base of the triode U2 is grounded by the discharge tube ESD3.

* * * * *